US007019969B2

(12) United States Patent
Foster, Sr. et al.

(10) Patent No.: US 7,019,969 B2
(45) Date of Patent: Mar. 28, 2006

(54) DUAL FAN HEAT SINK WITH FLOW DIRECTORS

(75) Inventors: Jimmy Grant Foster, Sr., Morrisville, NC (US); Michael Sean June, Raleigh, NC (US); Albert Vincent Makley, Raleigh, NC (US); Jason Aaron Matteson, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 15 days.

(21) Appl. No.: 10/881,357

(22) Filed: Jun. 30, 2004

(65) Prior Publication Data

US 2006/0002083 A1 Jan. 5, 2006

(51) Int. Cl.
*H05K 7/20* (2006.01)

(52) U.S. Cl. ...................... 361/695; 361/697; 361/703; 257/722; 165/80.3; 165/185; 174/16.3

(58) Field of Classification Search ................ 361/694, 361/695, 697, 703; 257/721, 722; 174/16.3; 165/80.3, 185
See application file for complete search history.

(56) References Cited

U.S. PATENT DOCUMENTS

| | | | | |
|---|---|---|---|---|
| 5,787,971 | A | 8/1998 | Dodson | |
| 6,382,306 | B1 * | 5/2002 | Hsu | 165/80.3 |
| 6,450,251 | B1 * | 9/2002 | Lin et al. | 165/122 |
| 6,501,651 | B1 | 12/2002 | Lin et al. | |
| 6,505,680 | B1 * | 1/2003 | Hegde | 165/80.3 |
| 6,512,673 | B1 | 1/2003 | Wiley | |
| 6,598,667 | B1 * | 7/2003 | Kuo | 165/80.3 |
| 6,691,768 | B1 * | 2/2004 | Hsieh et al. | 165/80.3 |
| 6,816,373 | B1 * | 11/2004 | Lee et al. | 361/697 |
| 6,819,564 | B1 * | 11/2004 | Chung et al. | 361/697 |
| 6,883,592 | B1 * | 4/2005 | Lee | 165/80.3 |
| 6,899,164 | B1 * | 5/2005 | Li et al. | 165/80.3 |
| 2003/0128513 | A1 | 7/2003 | Wiley | |
| 2004/0190257 | A1 * | 9/2004 | Chang | 361/703 |
| 2004/0194923 | A1 * | 10/2004 | Chu | 165/80.3 |

FOREIGN PATENT DOCUMENTS

JP 9307034 A 11/1997

* cited by examiner

*Primary Examiner*—Boris Chervinsky
(74) *Attorney, Agent, or Firm*—Martin J. McKinley; Dillon & Yudell LLP

(57) ABSTRACT

A heat sink having air flow directors on each of multiple fins attached to a heat sink base. The air flow directors direct air flow from dual fans towards a geometric center of the heat sink base, which is above the hottest part of the integrated circuit (IC) package being cooled by the heat sink. In one embodiment, a protrusion in the geometric center of the heat sink base provides additional cooling from air impingement, and also directs air towards the upper portions of the fins. The use of dual fans allows the fans to run at a lower speed than a single fan, thus reducing an overall fan acoustic level. Furthermore, the dual fans allow for a backup fan if one of the fans should fail.

24 Claims, 5 Drawing Sheets

DUAL FAN HEAT SINK WITH FLOW DIRECTORS

BACKGROUND OF THE INVENTION

1. Technical Field

The present invention relates in general to the field of electronics, and in particular to electronic chips that generate extraneous heat during normal operation. More particularly, the present invention relates to a method and system for conducting heat away from an integrated circuit, which still more particularly may be a microprocessor.

2. Description of the Related Art

In a typical personal computer (PC), the main heat-generating component among the logic circuits is the processor, also referred to as the Central Processing Unit (CPU) or microprocessor (MP). As illustrated in FIG. 1*a*, a processor 102 is mounted in a socket 104, which is mounted on a (printed) circuit board 106 by mating pins 108 from the processor 102 into the socket 104. As processors continue to grow in performance, so does the heat generated by the processors. To remove heat from processor 102, a heat sink (HS) 110, having a HS base 112 and a plurality of fins 114, is secured to processor 102 by a strap 116 or other attachment means. Heat is conducted from the processor 102 to the HS base 112 and the fins 114, which dissipate heat by conduction and convection to ambient air surrounding fins 114. To provide thermal conduction between a top surface 120 of processor 102 and the HS base 112, thermal grease 118, typically a thermally conductive silicon or filled hydrocarbon grease doped with fillings such as metals, is used.

A major problem with the heat sink 110 shown in FIG. 1*a* is that it relies on conduction to the ambient air, which may or may not be moving enough to significantly convey away heat, depending on movement of air about the heat sink caused by fan(s) in a computer case that houses the processor 102. To aid in this air movement, a heat sink fan 122, as shown in FIG. 1*b*, is often used. Heat sink fan 122 includes fan blades 124 that rotate about a hub 126. Thus, there is a "dead space" below hub 126 in which there is minimal air movement. This is especially problematic since it is typically the center of processor 102 that generates the most heat. Thus, the area of processor 102 and its adjacent HS base 112 that needs the most cooling actually receives the least amount of help from heat sink fan 122.

What is needed therefore is a device that provides maximum cooling to the center portion of processor 102 and HS base 112.

SUMMARY OF THE INVENTION

The present invention is therefore directed to a heat sink having air flow directors on each of multiple fins attached to a heat sink base. The air flow directors direct air flow from dual fans towards a geometric center of the heat sink base, which is above the hottest part of the integrated circuit (IC) package being cooled by the heat sink. In one embodiment, a protrusion in the geometric center of the heat sink base provides additional cooling from air impingement, and also directs air towards the upper portions of the fins. The use of dual fans allows the fans to run at a lower speed than a single fan, thus reducing an overall fan acoustic level. Furthermore, the dual fans allow for a backup fan if one of the fans should fail.

The above, as well as additional objectives, features, and advantages of the present invention will become apparent in the following detailed written description.

BRIEF DESCRIPTION OF THE DRAWINGS

The novel features believed characteristic of the invention are set forth in the appended claims. The invention itself, however, as well as a preferred mode of use, further purposes and advantages thereof, will best be understood by reference to the following detailed description of an illustrative embodiment when read in conjunction with the accompanying drawings, where:

DETAILED DESCRIPTION OF A PREFERRED EMBODIMENT

Figure 2A:
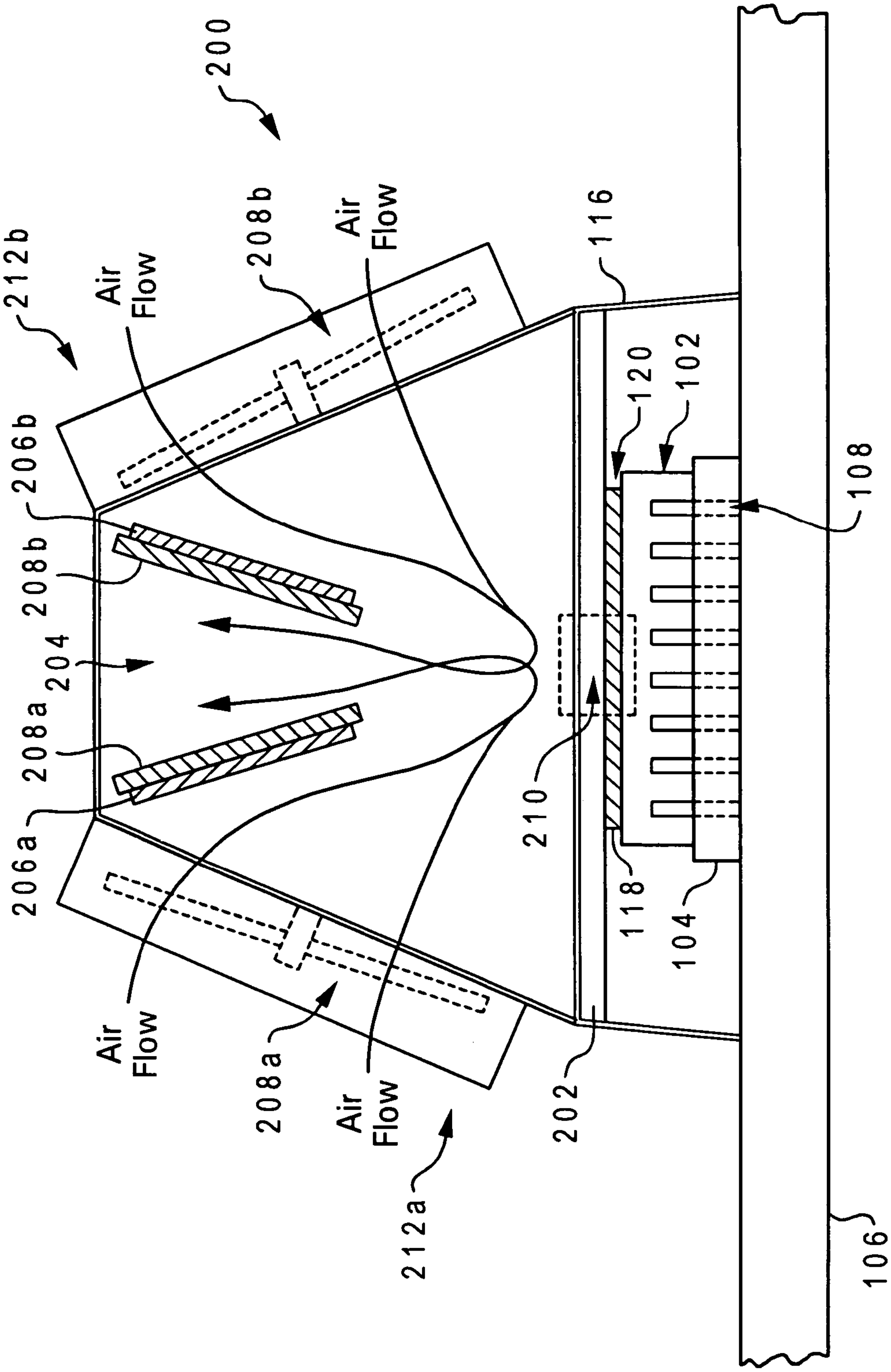
FIGS. 2*a*–*b* depicts the inventive heat sink having air flow directors on heat sink fins.

With reference now to FIG. 2*a*, there is depicted a novel baffled heat sink 200. Baffled heat sink 200 has a base 202, to which multiple baffled fins 204 are mounted, preferably being mounted normal (perpendicular) to the top of base 202. Each baffled fin 204 includes at least one air flow director 206, including air flow directors 206*a* and 206*b* depicted in FIG. 2*a*. Air flow directors 206 can be stamped out of baffled fins 204, leaving voids 208, or air flow directors 206 can be manufactured separately and attached to unstamped fins, resulting in no voids 208.

Figure 1A:
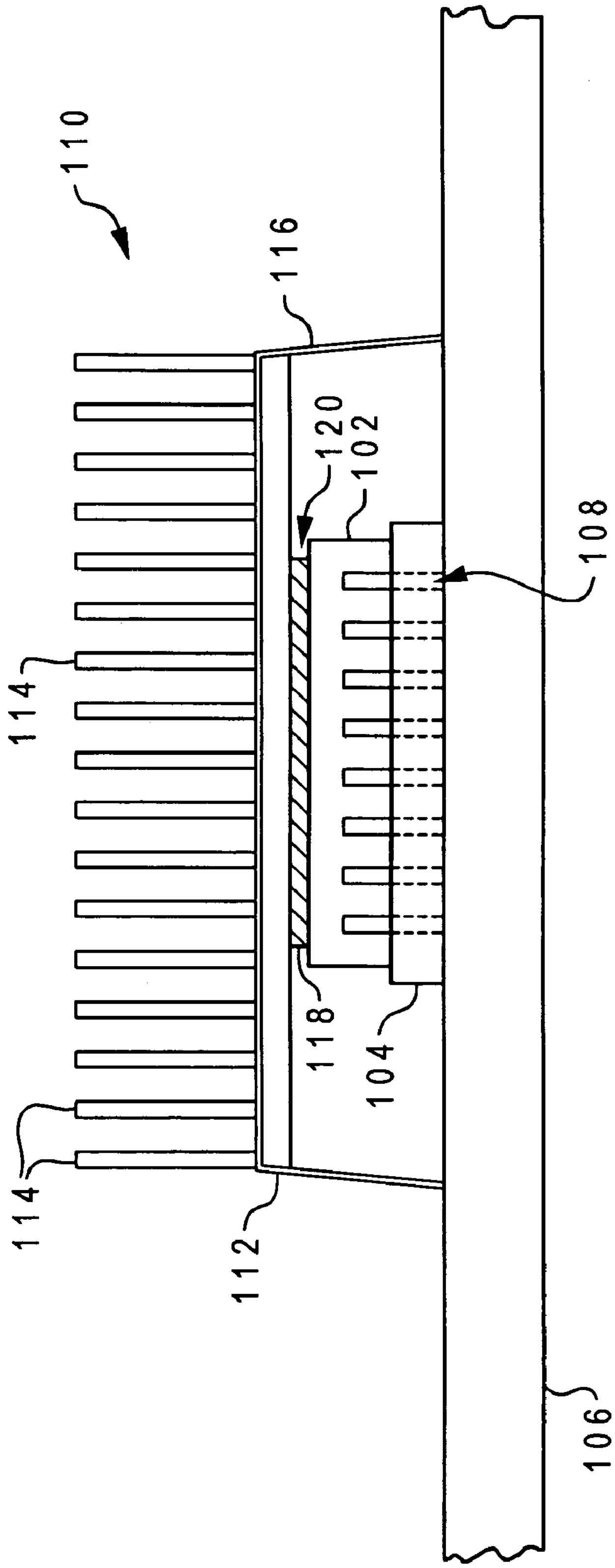
FIG. 1*a* depicts a prior art heat sink mounted against an integrated circuit (IC) chip package.
Figure 1B:
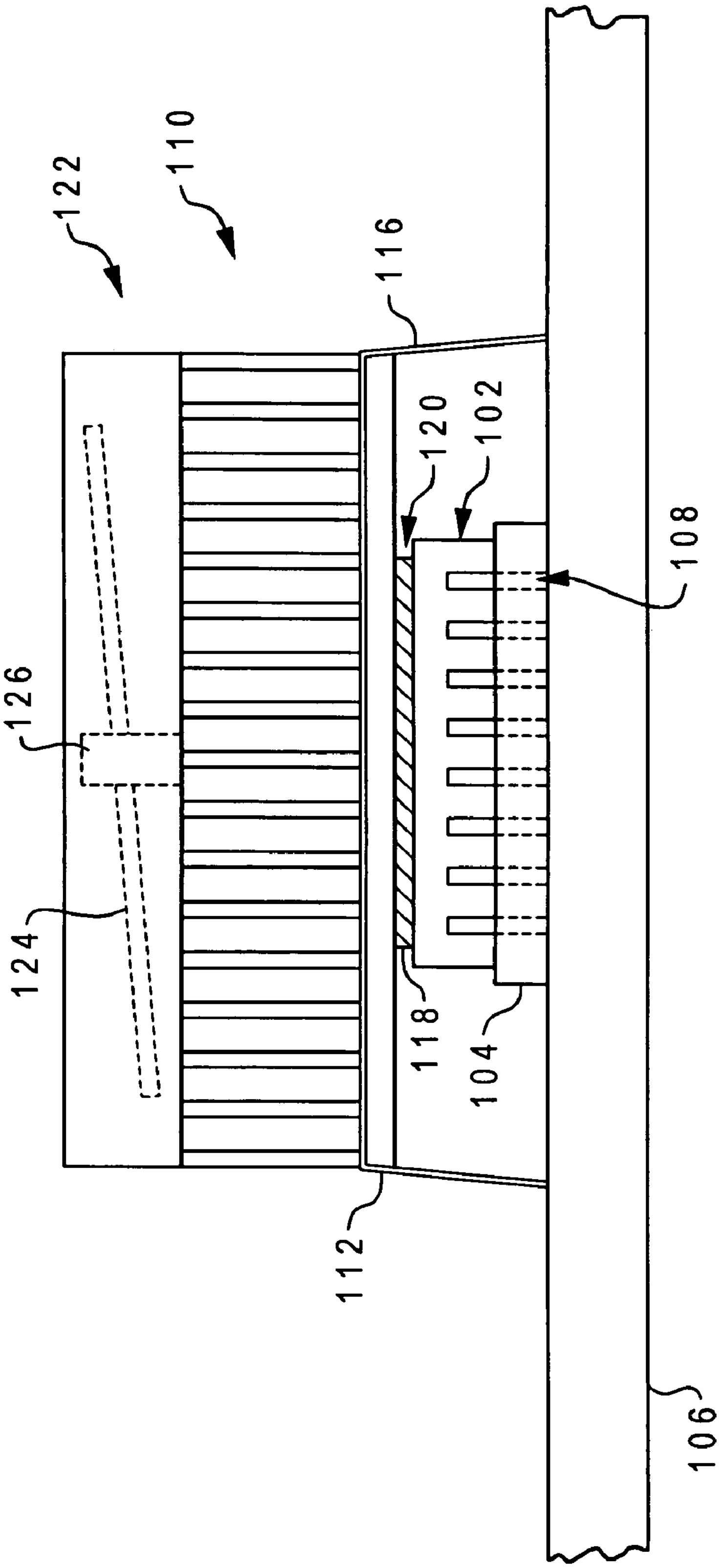
FIG. 1*b* illustrates the prior art heat sink with a conventional heat sink fan.

Baffled heat sink 200 is secured above and against processor 102 in any manner known to those skilled in the art of heat sinks, including the manner described above for FIG. 1*a*, and will not be reiterated here.

Note that the geometric center of base 202 is oriented above a center of processor 102. This orientation is significant since in the center of processor 102 is a "hot spot" 210 where the greatest amount of heat is generated. The air flow directors 206 direct air from heat sink fans 212 towards hot spot 210, resulting in maximum cooling benefit from the directed air.

Figure 2B:
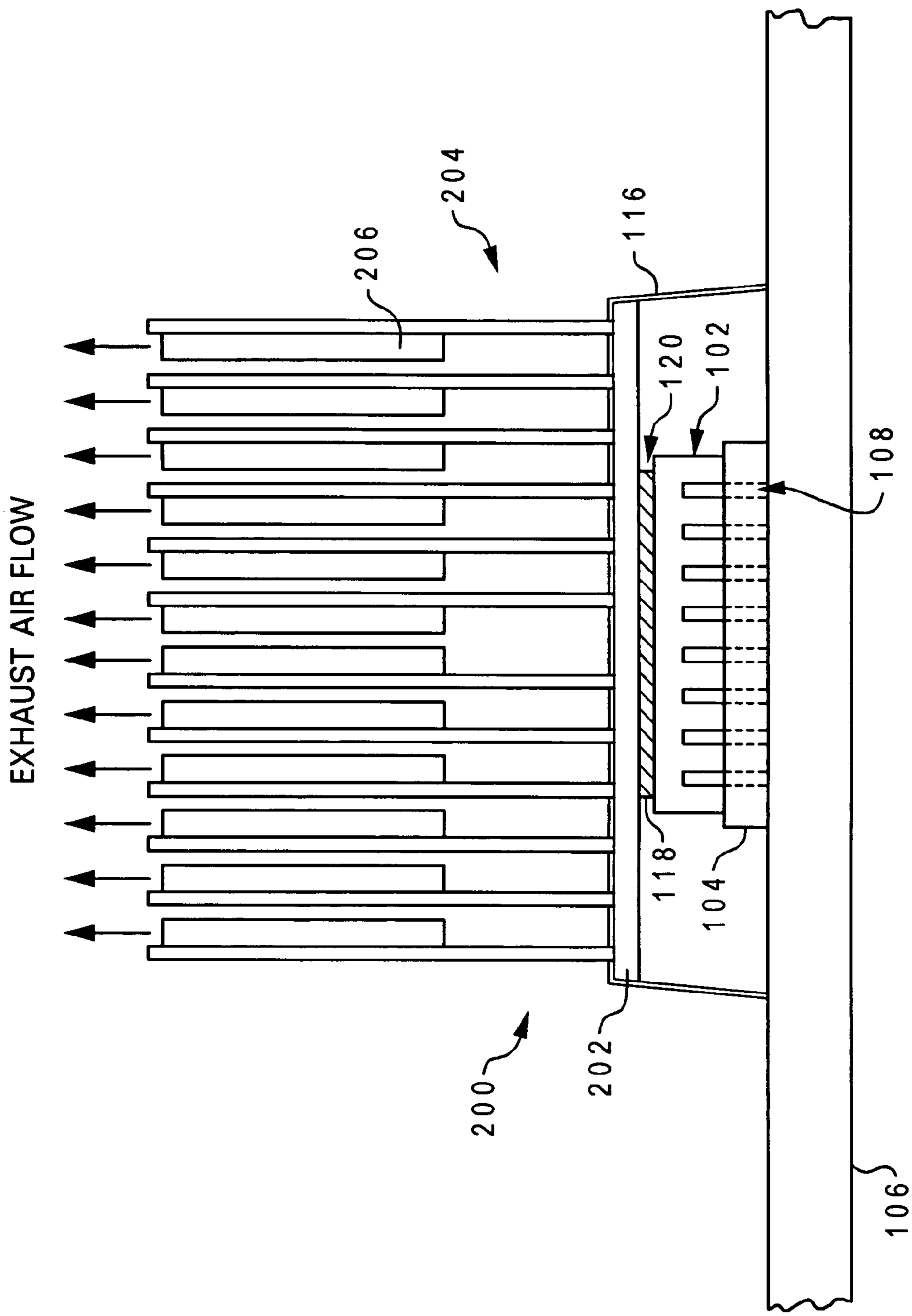

FIG. 2*b* illustrates baffled fins 204 with the heat sink fans 212 removed for clarity of illustration. Note that the exhaust air flow is away from the base 202 of baffled heat sink 200, resulting in maximum cooling benefit of the air flow that was directed to the midline and to the geometric center of base 202.

Figure 3:
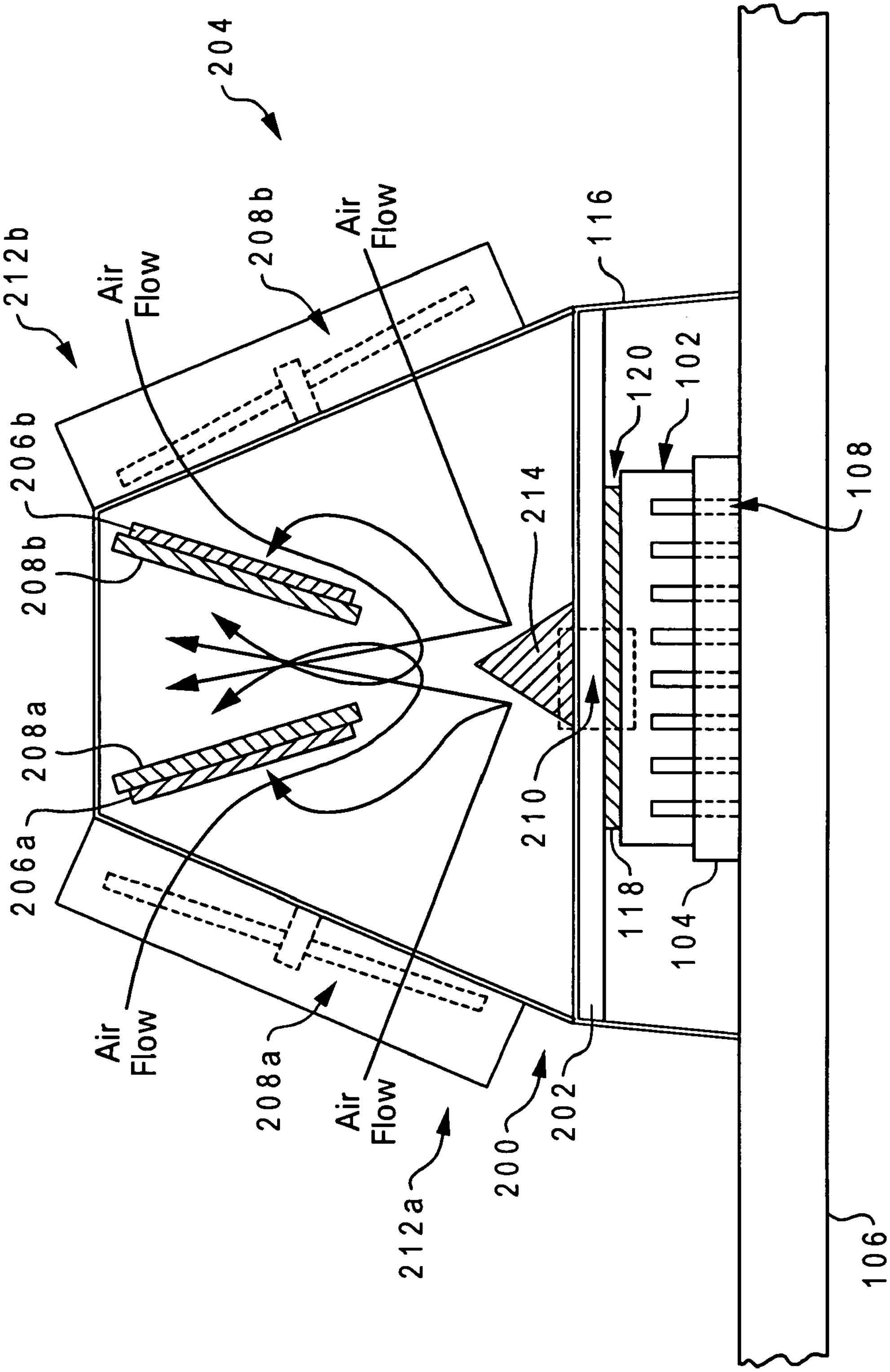
FIG. 3 illustrates the inventive heat sink having a preferred protrusion in a geometric center of a heat sink base to which the heat sink fins are attached.

With reference now to FIG. 3, a protrusion 214 extends away from base 202 in the area of hot spot 210. Protrusion 214 provides two main benefits. First, air flow from fan blades 208 in heat sink fans 212 is impinged in a normal direction against the surfaces of protrusion 214, resulting in additional heat removal capacity from the air flow according to principals of thermodynamics and heat removal as understood by those skilled in the art. Second, protrusion 214 directs the air flow against air flow directors 206 and baffled fins 204, resulting in their additional cooling, and thus the additional cooling of processor 102.

Having dual heat sink fans 212 provides two benefits. First, by having two fans instead of one fan, the two fans are able to operate at a lower speed (RPM) than a single fan, thus reducing the amount of vibration and noise created by the two fans. Second, the two fans allows one of the heat sink fans 212*a* to be a backup to the other heat sink fan 212*b*, in case heat sink fan 212*a* should fail. Third, heat sink fan

212*b* may optionally be turned on only if heat sink fan 212*a* is unable to provide adequate cooling of processor 102, as determined and measured by any technique known to those skilled in the art of processor temperature control.

The present invention therefore provides a quiet and efficient method of removing heat from an IC chip by directing air flow to the hot spot where the air is needed the most. The system results in a minimal reduction in pressure drop and increased air flow across the hot spot, as well as a reduction in laminar boundary layers.

While the invention has been particularly shown and described with reference to a preferred embodiment, it will be understood by those skilled in the art that various changes in form and detail may be made therein without departing from the spirit and scope of the invention. For example, the present invention may be useful with any heat generating device, and particularly any heat generating integrated circuit package.

Note that while the air flow directors have been illustrated and described as extending from only one side of each fin, alternatively the air flow directors can extend from both sides of one or more of the fins in the heat sink.

While terms such as "above" and "beneath" have been used to describe the spatial orientation and movement of different components, such terms are used generically, and the present invention as described and claimed is to include orientations so generally described, but not limited to such "up/down" definitions.

What is claimed is:

1. A system comprising:

a heat sink having:

a heat sink base that has a geometric center; and a plurality of fins attached to the heat sink base, each of the fins having at least one air flow director on a side of said fin, wherein the at least one air flow director directs a flow of air from a fan towards the geometric center of the heat sink base.

2. The system of claim 1, wherein the heat sink further comprises:

a base protrusion extending from the geometric center of the heat sink base, wherein the base protrusion is impinged by air from the fan to provide additional heat removal from the geometric center of the heat sink.

3. The system of claim 2, wherein the base protrusion has a conical shape.

4. The system of claim 3, wherein the base protrusion has concave surfaces.

5. The system of claim 2, wherein the base protrusion is a pyramid having flat sides.

6. The system of claim 1, wherein the air flow director is formed by stamping a slot in the side of the fin and using the stamped material as the air flow director.

7. The system of claim 1, wherein the air flow director is attached to an unstamped fin.

8. The system of claim 1, further comprising a plurality of fans that force air against the geometric center of the heat sink base using the flow directors on the plurality of fins.

9. A heat sink comprising:

a heat sink base that has a geometric center; and a plurality of fins attached to the heat sink base, each of the fins having at least one air flow director on a side of said fin, wherein the at least one air flow director directs a flow of air from a fan towards the geometric center of the heat sink base.

10. The heat sink of claim 9, further comprising:

a base protrusion extending from the geometric center of the heat sink base, wherein the base protrusion is impinged by air from the fan to provide additional heat removal from the geometric center of the heat sink.

11. The heat sink of claim 10, wherein the base protrusion has a conical shape.

12. The heat sink of claim 11, wherein the base protrusion has concave surfaces.

13. The heat sink of claim 10, wherein the base protrusion is a pyramid having flat sides.

14. The heat sink of claim 9, wherein the air flow director is formed by stamping a slot in the side of the fin and using the stamped material as the air flow director.

15. The heat sink of claim 9, wherein the air flow director is attached to an unstamped fin.

16. The heat sink of claim 9, wherein the base protrusion is shaped to reflect forced air from the fan against the air flow directors.

17. A method comprising:

mounting a heat sink against a heat generating package, the heat sink having:

a heat sink base that has a geometric center; and a plurality of fins attached to the heat sink base, each of the fins having at least one air flow director on a side of said fin, wherein the at least one air flow director directs a flow of air from a fan towards the geometric center of the heat sink base.

18. The method of claim 17, wherein the heat sink further comprises:

a base protrusion extending from the geometric center of the heat sink base, wherein the base protrusion is impinged by air from the fan to provide additional heat removal from the geometric center of the heat sink.

19. The method of claim 18, wherein the base protrusion has a conical shape.

20. The method of claim 18, wherein the base protrusion has concave surfaces.

21. The method of claim 18, wherein the base protrusion is a pyramid having flat sides.

22. The method of claim 18, wherein the air flow director is formed by stamping a slot in the side of the fin and using the stamped material as the air flow director.

23. The method of claim 17, wherein the air flow director is attached to an unstamped fin.

24. The method of claim 17, wherein the base protrusion is shaped to reflect forced air from the fan against the plurality of fins.

* * * * *